United States Patent [19]

Ramde

[11] Patent Number: 5,151,378
[45] Date of Patent: Sep. 29, 1992

[54] SELF-ALIGNED PLANAR MONOLITHIC INTEGRATED CIRCUIT VERTICAL TRANSISTOR PROCESS

[75] Inventor: Amolak R. Ramde, San Jose, Calif.

[73] Assignee: National Semiconductor Corporation, Santa Clara, Calif.

[21] Appl. No.: 861,404

[22] Filed: Mar. 31, 1992

Related U.S. Application Data

[62] Division of Ser. No. 716,890, Jun. 18, 1991.

[51] Int. Cl.⁵ .......................................... H01L 21/265
[52] U.S. Cl. ........................................ 437/31; 437/59; 437/162; 148/DIG. 10; 148/DIG. 11
[58] Field of Search ................... 437/31, 59, 162, 909; 148/DIG. 9, DIG. 10, DIG. 11; 357/34, 43

[56] References Cited

U.S. PATENT DOCUMENTS

| | | | |
|---|---|---|---|
| 4,357,622 | 11/1982 | Magdo et al. | 437/31 |
| 4,512,815 | 4/1985 | Khadder et al. | 437/31 |
| 4,577,397 | 3/1986 | Komatsu et al. | 437/31 |
| 4,719,185 | 1/1988 | Goth | 437/31 |
| 4,978,630 | 12/1990 | Kim | 437/162 |
| 4,999,309 | 3/1991 | Buynoski | 437/31 |

Primary Examiner—Brian E. Hearn
Assistant Examiner—Tuan Nguyen
Attorney, Agent, or Firm—Gail W. Woodward; Irving S. Rappaport; James W. Rose

[57] ABSTRACT

A process for creating self-aligned vertically arrayed planar transistors. The preferred embodiment relates to the simultaneous fabrication of both NPN and PNP planar vertically arrayed transistors in a conventional monolithic, epitaxial, PN junction isolated, integrated circuit. A field oxide is employed to surface isolate the devices and assist in the self-alignment improvement.

2 Claims, 4 Drawing Sheets

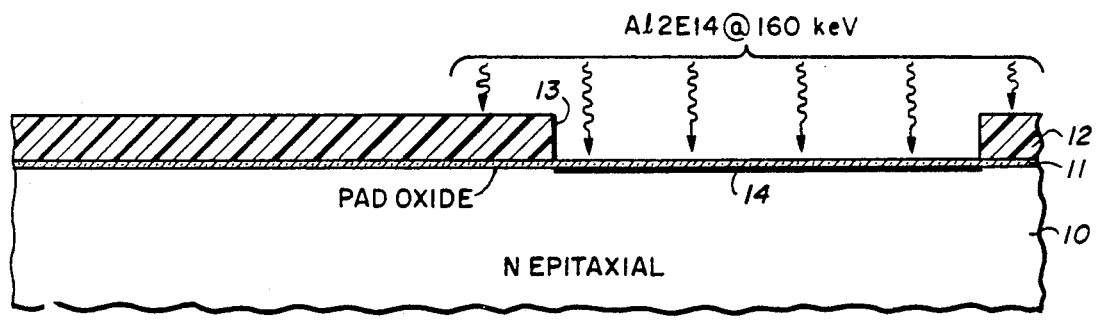
Fig._1
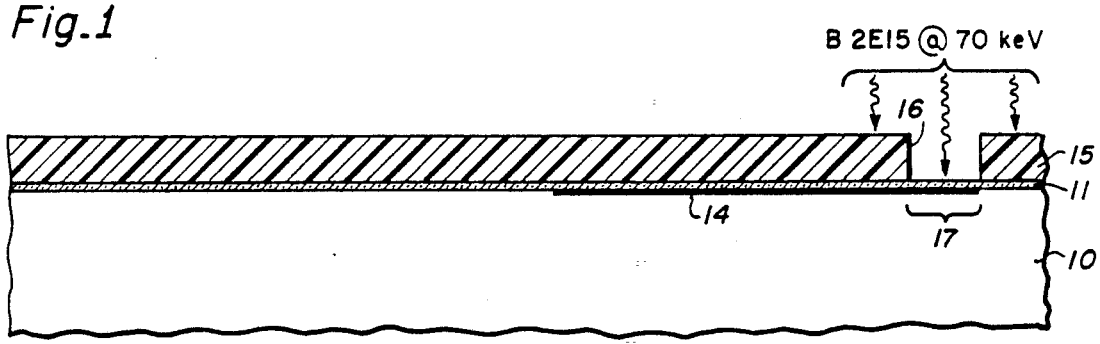
Fig._2
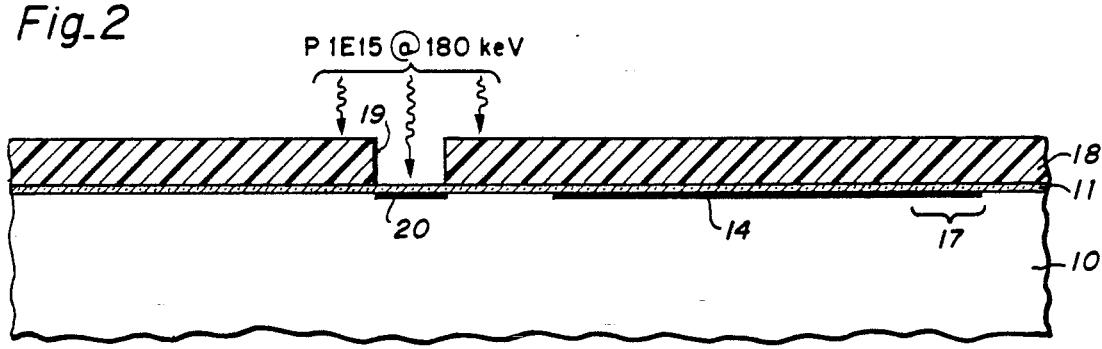
Fig._3
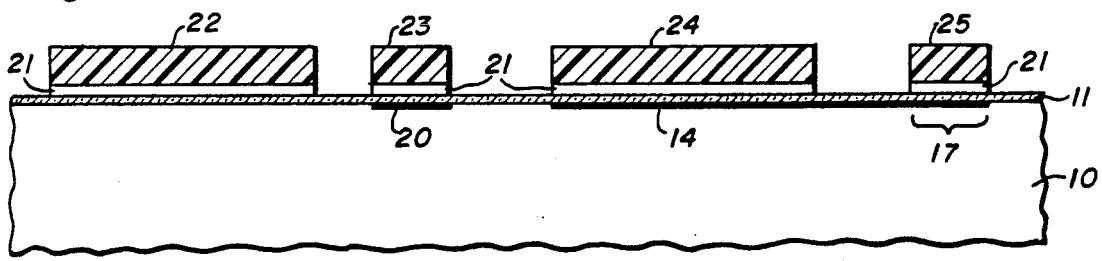
Fig._4
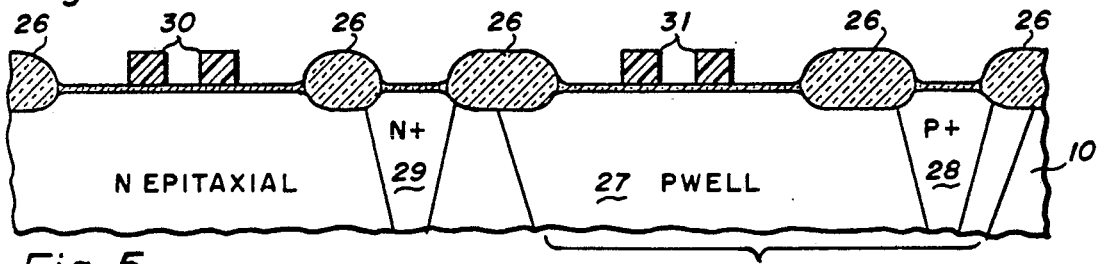
Fig._5

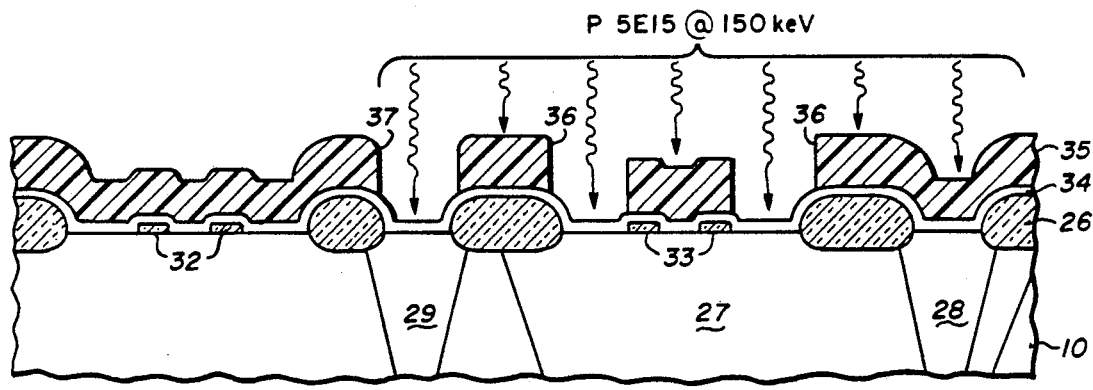
Fig_6
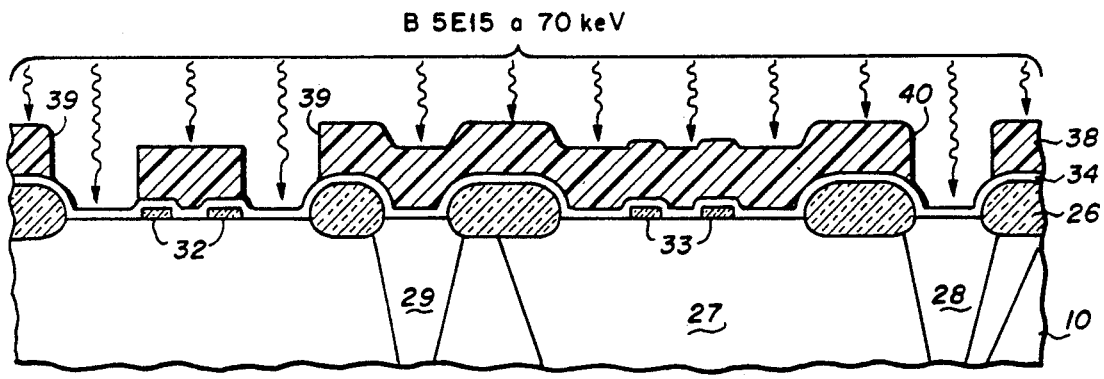
Fig_7
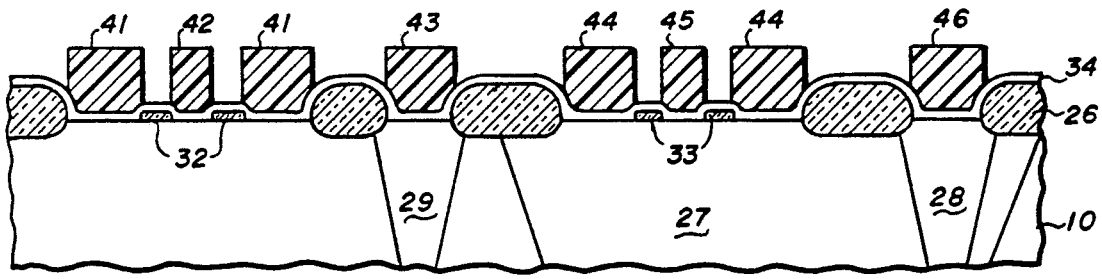
Fig_8
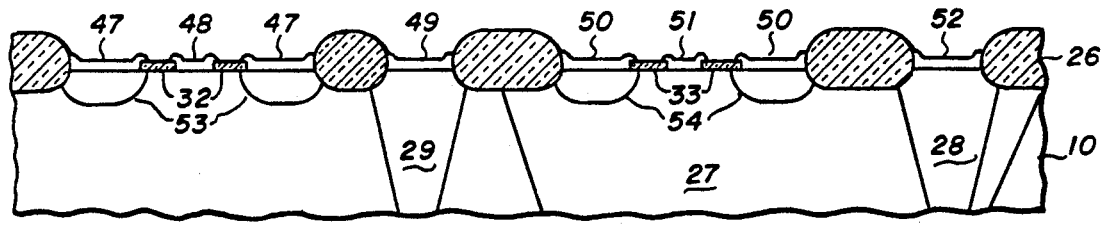
Fig_9

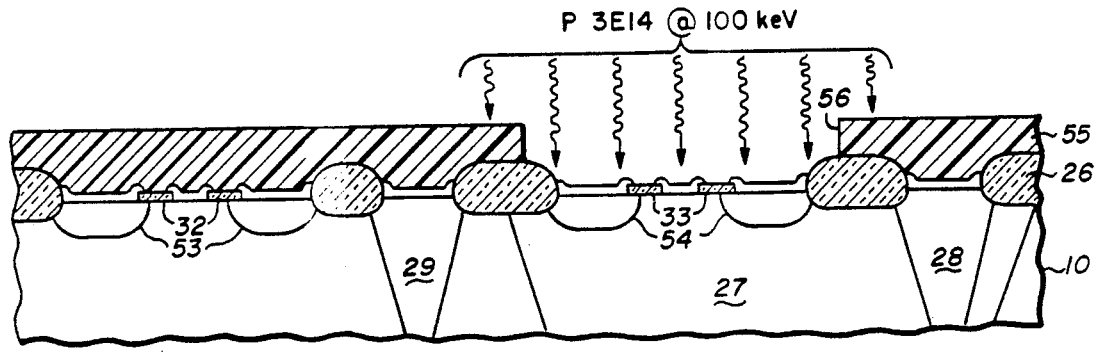
Fig_10
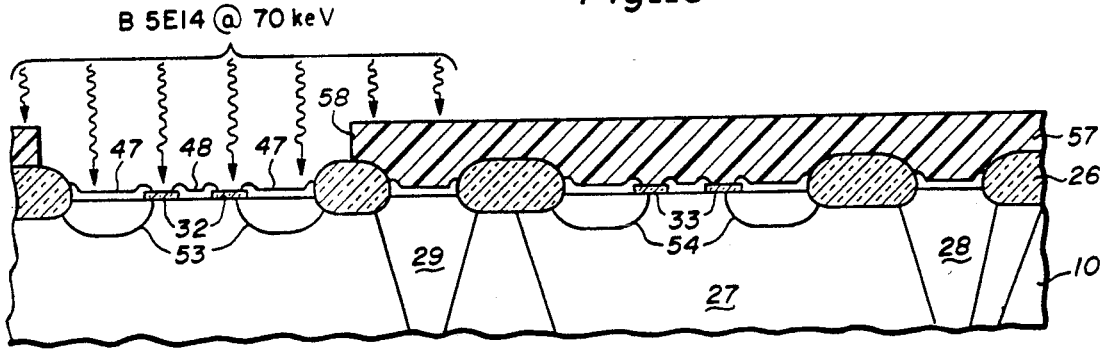
Fig_11
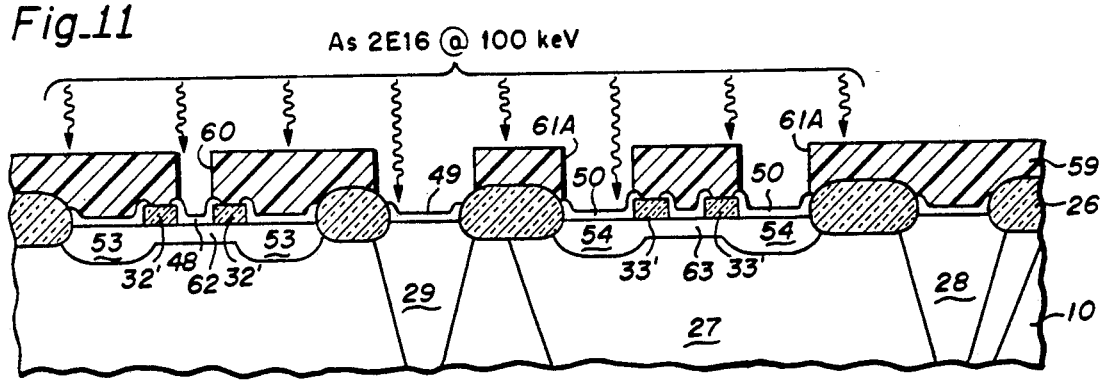
Fig_12
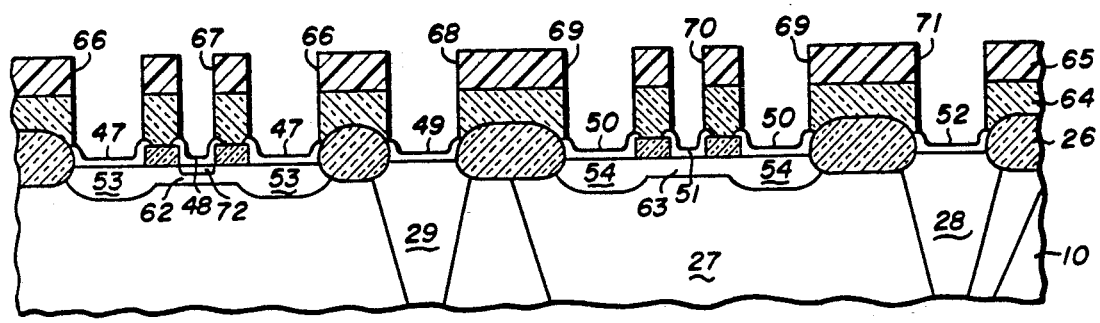
Fig_13

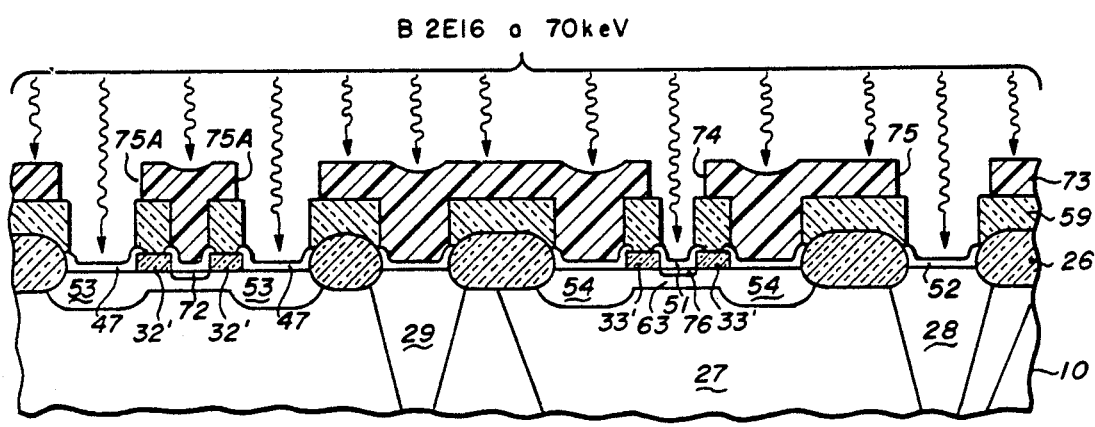
Fig_14
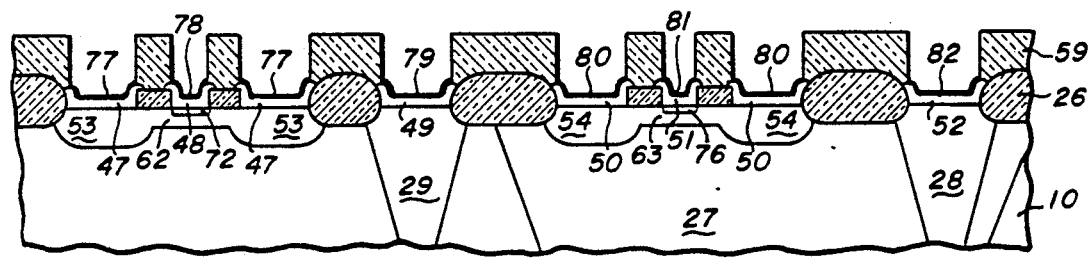
Fig_15
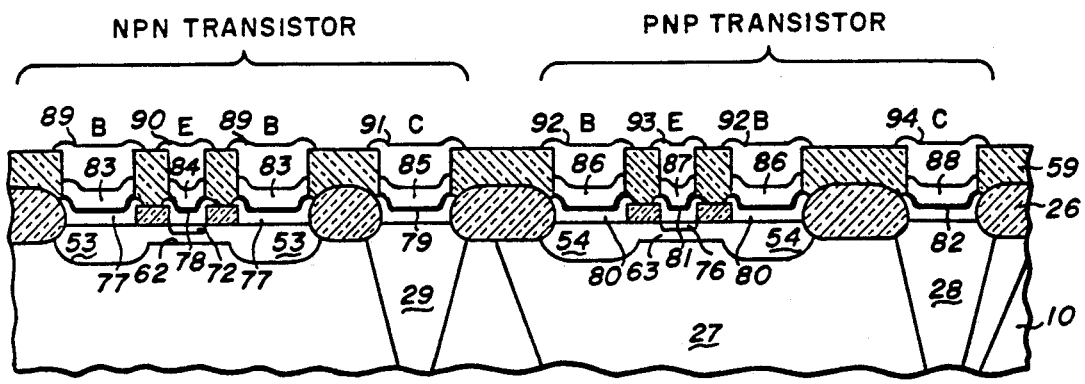
Fig_16

SELF-ALIGNED PLANAR MONOLITHIC INTEGRATED CIRCUIT VERTICAL TRANSISTOR PROCESS

This is a division of copending application Ser. No. 07/716,890 filed on Jun. 18, 1991.

BACKGROUND OF THE INVENTION

The invention relates to the fabrication of vertically constructed planar transistors in a monolithic semiconductor substrate wherein high precision of the photolithographic masking operations is not required to have perfect alignment. The process is self-aligning. While the process can easily be applied in the fabrication of discrete transistors its main benefit is realized in the fabrication of IC devices that incorporate vertical PNP and NPN transistors that can be simultaneously fabricated into a silicon wafer using the well-known planar, PN junction isolation, monolithic IC structure.

U.S. Pat. No. 4,940,671, issued on Jul. 10, 1990, to J. Barry Small and Matthew S. Buynoski. It relates to an IC structure in which substantially conventional high performance NPN transistors are fabricated simultaneously with vertical high performance PNP transistors. Both transistor types can be independently optimized to provide high electrical performance and the process produces PNP and NPN devices that are substantially matched and complementary. U.S. Pat. No. 4,910,160, issued on Mar. 20, 1990, to Dean C. Jennings and Matthew S. Buynoski, It also relates to the process disclosed in U.S. Pat. No. 4,940,671, but sets forth improvements related to power transistor construction.

These two patents are assigned to the assignee of the present invention and their teachings are incorporated herein by reference. The processes disclosed in the two patents have been employed to produce an IC product line known by the trademark VIP ™ process IC devices. VIP is developed as an acronym for vertically integrated PNP. This development is significant because the standard IC devices previously employed, either lateral PNP transistors or substrate collector PNP transistors, both of which displayed undesirable characteristics. The prior art lateral transistors typically had low current gain performance and limited frequency response. The substrate collector devices had good current gain, but could not be electrically isolated and operated independently.

The invention relates to a process that employs self alignment in the photolithographic processes. While it could be employed in other planar process applications, including discrete devices, its main interest lies in its use in the fabrication of VIP process IC devices.

SUMMARY OF THE INVENTION

It is an object of the invention to provide a process in which high performance planar transistors are fabricated into a semiconductor using self-aligned photolithographic processing.

It is a further object of the invention to provide a self-aligned IC fabrication process that will produce high performance NPN and PNP transistors simultaneously in a planar device fabrication process.

It is a still further object of the invention to provide a self-aligned planar transistor photolithographic masking process suitable for producing high performance vertical PNP and NPN transistors simultaneously in a monolithic integrated circuit process.

These and other objects are achieved in the following manner. The transistors to be fabricated are to be constructed into an N type silicon substrate such as would be found in the epitaxial layer that is located upon a P type silicon substrate wafer employed in the conventional photolithographically produced form of monolithic silicon PN junction isolated IC devices. Photolithography is employed to form the devices in the conventional manner. A field oxide is employed for surface isolation and is achieved using a photolithographically contoured silicon nitride oxidation resist.

The transistors to be produced are located over high conductivity buried layers that exist at the substrate-epitaxial layer interface. Each transistor has a collector contact, an emitter region, an intrinsic, or active, base region that lies directly under the emitter, a high conductivity or extrinsic base region that surrounds the intrinsic base and is spaced therefrom to provide a low resistance base connection, and a link base region that exists between the intrinsic and extrinsic base regions. The link base region has an intermediate resistivity and provides the link between the intrinsic base and the extrinsic base and helps to keep the base resistance low. The process permits controlling the shape and doping of the link base region. This link base results in a transistor having its collector breakdown voltage determined by the epitaxial material. Thus, the transistors produced can easily have $BV_{CBO}$ voltages (collector to base breakdown voltage with emitter open circuited) in excess of 50 volts.

The essential device process includes the following steps. First, the freshly grown epitaxial layer on a silicon wafer is covered with a thin layer of oxide referred to as the pad oxide. Then, a photolithographic mask is applied to the wafer so as to have openings where the PNP transistors are to be located. A P well is created using aluminum implanted in a concentration designed to optimize the PNP transistor collectors. Then, using photolithographic masking, the collector contact regions are exposed. This is a two-step process where the N and P type contacts are produced sequentially. A heavy dose of boron is ion implanted through the mask openings and the exposed thin pad oxide into the epitaxial layer where the PNP transistor collector contacts are to be located and a heavy dose of phosphorous is similarly ion implanted where the NPN transistor collector contacts are to be located.

After stripping the mask material from the wafer surface a layer of silicon nitride is deposited over the wafer. Then, a photolithographic etching mask is applied so as to cover active PNP and NPN transistor regions and their previously implanted collector contact regions. Then, the exposed nitride layer is etched away. After the mask is removed the wafer is subjected to a high temperature diffusion operation in an oxidizing atmosphere. In this step the PNP transistor collector, as well as the collector contact impurities, diffuse into the silicon surface and a thick oxide is grown over the wafer except where the masking nitride is present. This step provides the field oxide that will isolate the transistors around their periphery at the wafer surface. The collector contact regions will have contact diffusions that extend into the wafer over the high conductivity buried layers for making low resistance contacts thereto.

At this point, the silicon nitride that masked the thick oxide growth is removed by means of a selective etch that will not attack the oxide and a new photolithographic mask applied. This mask is shaped to define the transistor link base regions for both the PNP and NPN transistors. It exists in the form of a pair of rings, the inner portions of which will ultimately define the transistor emitters. The outer portions of the ring will abut the extrinsic transistor bases. The mask is employed to define an isotropic etch that will remove the thin pad oxide except for where the link base is to be located. After etching, the mask is removed.

Then, a layer of polysilicon is deposited over the wafer. Since this layer is undoped it will be electrically inactive. At this point, photolithographic ion implant masks are applied so as to provide openings where the transistor active bases and collector contacts are to be located and suitable ion implants employed to dope the exposed poly silicon. This is a two step process wherein the NPN extrinsic bases and the PNP collector contacts are subjected to a heavy ion implant of boron and the PNP extrinsic bases and NPN collector contacts are subjected to a heavy ion implant of phosphorous.

The ion implant mask is then stripped from the wafer and an etch resistant photolithographic mask applied over the wafer. This mask covers and thereby defines the transistor emitters, extrinsic bases and collector contact regions. The thus exposed polysilicon is then selectively removed leaving undoped emitter polysilicon and heavily doped extrinsic base and collector contact polysilicon.

The mask is stripped away and the wafer subjected to a diffusion in an inert atmosphere. In this step the heavily doped polysilicon will diffuse suitable impurities into the transistor extrinsic base and collector contacts. However, the emitter regions will be unchanged.

Then, an ion implant photolithographic mask is applied so as to expose the three PNP transistor base regions—namely, the extrinsic, link and intrinsic bases. Phosphorous is then implanted at a dose level that is selected to produce the desired PNP transistor intrinsic base doping. The implant energy is selected to substantially penetrate the intervening surface layers so that the silicon surface is activated. The photolithographic mask is then stripped off and another one applied to have openings over the three NPN transistor base areas. Boron is then ion implanted into the wafer at a dose that is selected to produce the desired NPN transistor intrinsic base doping. Again, the energy is selected to dope the silicon. At this point, the mask is stripped off and a transistor base diffusion performed in an oxidizing atmosphere. During this base diffusion the thin pad oxide increases in thickness and it grows to a substantially increased thickness. The other wafer oxide regions, having relatively thick field oxides, will be substantially unchanged. Thus, while the original pad oxide was relatively transparent to an ion implant it now, in its thickened state, can be employed as an ion implant mask in the subsequent self-alignment process.

A new photolithographic ion implant mask is applied to the wafer having openings where NPN transistor emitters and collector contacts are to be located and a heavy dose of arsenic is ion implanted into the thus exposed polysilicon. The implant energy is selected to dope the polysilicon, but is insufficient to penetrate the thickened pad oxide below the photolithographic masking material. Thus, this emitter doping is self-aligned to be confined to the NPN transistor emitter regions (and the collector contact regions).

Then the mask is stripped from the wafer and a low temperature oxide deposited over the wafer so as to create a passivation layer. This layer can be reflowed thereby providing a leveled upper wafer surface and it also produces an impurity gettering action which is followed by an HF dip that removes the outer glass surface layer.

Then an etch resisting photolithographic mask is applied having openings that align with the poly that covers the transistor emitters, extrinsic bases, and collector contacts. The exposed contacts are then stripped of oxide and the mask removed.

At this point, the previously implanted arsenic is diffused in an oxidizing atmosphere to produce the NPN transistor emitters and low resistance collector contacts. At the same time all of the exposed polysilicon is oxidized.

Then an ion implant photolithographic mask is applied having openings where PNP transistor emitters and collector contacts are to be located. A heavy boron implant is then applied at an energy that will partially penetrate the polysilicon so as to dope the underlying silicon with the thickened pad oxide acting as a self-alignment mask. Then, the mask is stripped off and the wafer is annealed to activate the ion implanted boron.

After the foregoing steps have been completed a conventional contact etch and metallization is performed to complete the process and provide the required transistor electrode connections.

BRIEF DESCRIPTION OF THE DRAWING

FIGS. 1 through 16 represent silicon wafer fragmental cross-sections that portray the various stages of wafer preparation for creating the PNP and NPN transistors. The NPN transistors are on the left and the PNP transistors are on the right. The dimensions are not to scale. The vertical dimensions have been exaggerated for clarity.

DESCRIPTION OF THE INVENTION

It is to be understood that the simultaneous fabrication of PNP and NPN transistors is shown in the following description. However, the process of the invention could be applied to the manufacture of discrete planar transistors. The preferred embodiment of the invention relates to its use with VIP process IC devices, the basic processes of which are set forth in U.S. Pat. Nos. 4,940,671 and 4,910,160 mentioned above. However, the basic wafer processes, particularly those employed prior to the deposition of the epitaxial layer, will be omitted because they mainly relate to the establishing of isolated buried conductive layers. Also, the fabrication of the well-known PN junction isolation is not detailed so as to avoid complicating the drawing unnecessarily. As can be determined from the above two patents conventional up-down diffusion is employed to provide the preferred form of isolation.

With reference to FIG. 1, semiconductor substrate 10 represents a cross-section of a semiconductor wafer of <111> orientation that includes an N type epitaxial layer region. Typically, it will have a resistivity of about 3 ohm centimeters N type and will be about 8 microns thick. Substrate 10 is the upper portion of such an epitaxial layer. A thin pad oxide 11 is located on the surface. While this oxide layer is typically grown at high temperature, it could be created by some other process. Nominally, it is about 1000 Å ± 100 thick. A first photoresist 12 is applied as a layer to the wafer and photo processed to produce an opening 13 therein. The oxide 11 is left in place. In the subsequent ion implantation the deposited ions can be accelerated to a speed at which they will penetrate the oxide and enter into the underlying silicon. This approach is preferred because the thin oxide will act as a pad, or cushion, for the impinging ions which will then be retained within the silicon. As a practical matter, the ion implant energy is selected so that the bulk of the ions will penetrate substantially into and remain within the silicon. However, if desired, the exposed oxide 11 can be etched away selectively to bare the silicon inside opening 13.

As shown, aluminum is ion implanted inside opening 13 to create an aluminum rich silicon region 14. The aluminum dose is $2 \times 10^{14}$ atoms per $cm^2$ at an energy of about 160 keV. This energy creates a slightly subsurface aluminum deposit. It will be noted that the drawing employs the conventional ion implant dose description.

Then the photoresist is removed and a second photoresist 15 applied as shown in FIG. 2. It is photo processed to create an opening 16 and the exposed oxide etched away. As shown, a relatively heavy boron dose, $2 \times 10^{15}$ atoms per $cm^2$, is implanted at about 70 keV to create a boron rich silicon region at 17. The photoresist is then removed.

With reference to FIG. 3, a third photoresist 18 is applied to the wafer and photo processed to create an opening 19 therein and phoshorous ions implanted at a heavy dose of $10^{15}$ atoms per $cm^2$ and an energy of about 180 keV. This creates a phosphorous rich region 20 in the silicon. The photoresist is then stripped away.

As shown in FIG. 4, a layer of silicon nitride 21 is deposited over the wafer. It is desirably about 1500 Å thick. A fourth photoresist is applied over the silicon nitride and photo processed to remove it everywhere except at regions 22, 23, 24 and 25. Region 22 defines where an active NPN transistor will be constructed, 23 defines the NPN transistor collector contact, 24 defines where an active PNP transistor will be constructed and 25 defines the PNP transistor collector contact. While not illustrated, these transistors have a topography that is determined by the surface shape of photoresist regions 22 through 25 and these are of conventional planar transistor form. Where desired, the shape can be of the minimum area feasible with the photolithographic processing and the highest frequency devices thereby created. However, if a power transistor is to be created, a larger area structure is produced with the attendant loss of higher frequency performance. Furthermore, if a high power transistor is desired, it can be composed of a plurality of small area sections that will ultimately be connected in parallel by metallization. In this latter case, the shape of photoresist regions 22 through 25 will be controlled for the optimum utilization of wafer surface area.

Then, the silicon nitride is selectively etched away, preferably using a well known plasma process, so as to leave it in place in the silicon nitride regions under the photoresist elements 22 through 25. The resist is then removed and the previously ion implanted dopants diffused in an oxidizing atmosphere. This results in a relatively thick (about 10000 Å ±500) oxide except where it is prevented by the presence of the silicon nitride. Silicon nitride is a well-known oxidation resistant material and the pad oxide is retained underneath as shown.

After the diffusion and oxide growth step the structure is shown in FIG. 5. It can be seen that the thick field oxide 26 now exists in the regions that are located between the previously silicon nitride covered regions. The ion implanted regions 14, 17 and 20 of FIGS. 1 through 4, have diffused into the epitaxial layer 10 to respectively form aluminum doped P well 27, boron doped P+ sinker 28 and phosphorous doped N+ sinker 29. Region 27 will subsequently have a PNP transistor created therein, region 28 will become the PNP transistor collector contact and region 29 will become the NPN transistor collector contact. At this point in the process, the silicon nitride is removed from the wafer using a hot phosphoric acid dip which does not attack the oxide.

Then, a fifth photoresist is applied and processed to exist, as shown, at 30 and 31, in FIG. 5. It will be noted that each of resists 30 and 31 will be in the form of rings which will ultimately define the transistor link bases. The inner confines of the ring will define the transistor emitters and the outer confines will abut the extrinsic bases. It will be noted that fifth photoresist elements 30 and 31 need only be located generally within the regions previously defined by elements 22 and 24 of the masking shown in FIG. 4. Thus, the fifth photo mask does not require precision location. This also applies to all of the previously described masks. In other words, the masking thus far produced do not require high precision alignment. However, the shape of the masks 30 and 31 does provide for high precision of the ultimate transistor link bases so that the parameter is capable of precision design control.

The structure shown in FIG. 5 is then subjected to an isotropic plasma etch that will selectively remove the silicon dioxide exposed outside of masks 30 and 31 while leaving the pad oxide. This results in leaving the link-base pad oxide in place. The link base oxide is labeled 32 in FIG. 6 for the NPN transistor and 33 for the PNP transistor.

At this point, the wafer is thoroughly cleaned and a layer of undoped polysilicon 34 deposited. Layer 34 is 5500 Å ±300 thick and is provided with a sixth photoresist layer 35, as shown in FIG. 6. This resist includes a ring shaped opening 36 where the PNP transistor extrinsic base will be located and opening 37 over the NPN transistor collector contact 29. At this point, a heavy phosphorous ion implant is performed. The dose is $5 \times 10^{15}$ atoms per $cm^2$ at an energy of 150 keV. This ion implant heavily dopes the polysilicon exposed inside the holes in resist 35. Note that the mask 35 openings simply span the regions to be doped and a precision alignment is again not needed. The actual alignment of the ion implant is produced by the field oxide 26.

Resist 35 is then stripped off and a seventh resist 38 applied as shown in FIG. 7. This resist has a ring shaped opening 39 located where the NPN transistor extrinsic base will be located and opening 40 in registry with the PNP transistor collector contact 28. Again, note that because of the field oxide this seventh resist hole pattern does not require precision alignment. At this point, a heavy boron ion implant is applied. Boron is deposited to a dose of $5 \times 10^{15}$ atoms per $cm^2$ at an energy of about 70 keV. This heavily dopes the polysilicon, exposed in openings 39 and 40, P+.

Then the resist is stripped off and the wafer coated with an eighth photoresist which is segmented photolithographically as shown in FIG. 8. This eighth resist covers the doped polysilicon in the regions of the transistor collector contacts, extrinsic bases and emitters. For example, ring shaped segment 41 covers the region of the extrinsic base of the NPN transistor, 42 covers the NPN transistor emitter region and 43 covers the NPN transistor collector contact. Ring shaped segment 44 covers the PNP transistor extrinsic base, segment 45 covers the PNP transistor emitter and segment 46 covers the PNP transistor collector contact.

The thus exposed polysilicon is then etched away in a selective etching process designed to attack polysilicon, but not $SiO_2$.

The photoresist mask is then removed and the wafer subjected to an extrinsic base diffusion drive in. This involves a heat cycle in an inert atmosphere such as dry nitrogen. Typically, the wafer is heated to about 1100° C. for about 50 minutes. This causes the heavily doped polysilicon that touches the silicon to supply impurities which diffuse into the silicon as shown at 53 and 54 in FIG. 9. These diffusions occur in the NPN and PNP extrinsic bases respectively. Contacts 49 and 52 will supply their impurities respectively to the NPN and PNP transistor collector contacts 29 and 28. However, since these latter impurities merely increase the contact doping they do not create PN junctions.

Then, as shown in FIG. 10, a ninth photoresist 55 is applied and photolithographically contoured as shown to create openings 56 that span the active portions of the PNP transistor. As before, this mask does not require precision alignment because field oxide 26 will confine or mask the subsequent ion implant precisely to the transistor active region. The phosphorous implant dose of $3 \times 10^{14}$ atoms per $cm^2$ is chosen to provide the desired intrinsic base resistivity and the energy of 100 keV selected to ensure that the phosphorous atoms implanted will substantially pass through the link base pad oxide 33. Where the implanted ions encounter polysilicon 51 and are absorbed they will be available for subsequent diffusion. Since this ion implant is of a dosage that is over an order of magnitude weaker than that of the extrinsic base implant, region 54 will be substantially unaffected.

The ninth photoresist 55 is removed and a tenth photoresist 57 applied and contoured as shown in FIG. 11. Opening 58 exists to span the active portion of the NPN transistor. Then, $5 \times 10^{14}$ atoms of boron per $cm^2$ are ion implanted at an energy of about 70 keV. This dosage is established to produce the desired intrinsic NPN base conductivity and the energy is selected to provide the desired ion penetration of the structure. As was the case for the PNP transistors, the ion implant is over an order of magnitude weaker than that of the extrinsic base implant. Accordingly, regions 53 will be substantially unaffected.

The photoresist is removed and the wafer carefully cleaned. Then, the wafer is subjected to a base diffusion cycle in an oxidizing atmosphere. This involves heating the wafer to about 1000° C. for about 60 minutes. The first 30 minutes involve a wet oxygen ambient and the last 30 minutes a dry oxygen ambient. The result is shown in FIG. 12. It can be seen that the ions implanted in FIGS. 10 and 11 have diffused into the wafer to for the transistor intrinsic and link base regions 62 and 63. The link bases abut the extrinsic bases and thereby connect them to the intrinsic bases.

An important process step is developed here. Since the pad oxides 32 and 33 that defines the link base regions, were exposed to an oxidizing atmosphere at elevated temperature, they grow to create thickened oxides as shown at 32' and 33' in FIG. 12. In fact, the thickened oxide will be 3000 Å±250 thick. While the original pad oxide was about 1000 Å thick, it was substantially transparent to ion implants. However, now that it has been thickened it can serve as an ion implant mask in subsequent process steps.

As shown in FIG. 12, an eleventh photoresist mask 59 is applied photolithographically to have openings 60, 61 and 61A, which are in general alignment with the emitter and the collector contact regions of the NPN transistor and the extrinsic base of the PNP transistor. Arsenic is then implanted to a very heavy dose of $2 \times 10^{16}$ atoms per $cm^2$ at an energy of about 100 keV. The polysilicon electrodes 48, 49 and 50, exposed through the photomask openings, will absorb the arsenic implant. Then, in a subsequent diffusion, to be described hereinafter, the arsenic will diffuse slightly into the intrinsic base region of the NPN transistor to create an emitter. Also, a heavily doped collector contact is created along with a heavily doped PNP transistor extrinsic base. These diffusions are confined to that surface region where contacts 48, 49 and 50 touch the silicon. Thus, it is automatically self-aligned within the exposed contacts. Again, the photolithographic masking does not require precision alignment.

Following the arsenic ion implant of FIG. 12, in which polysilicon contacts 48, 49 and 50 become very heavily doped with arsenic, the resist is removed from the wafer and, as shown in FIG. 13, a conventional low temperature oxide (LTO) 64 is created on the wafer. The LTO is initially $SiO_2$ deposited to a thickness of about 6000 Å±500. The wafer is then fired at about 950° C. in an atmosphere of $POCl_3$ (phosphorous oxychloride) wherein a surface layer of PSG (phosphosilicate glass) is formed. This is a low melting material which will flow to conform to the surface of the wafer and during which the LTO acts as a getter functioning to remove unwanted impurities, such as sodium and the like, from the wafer. This is followed by a 15-minute dip in 10:1 HF which removes the excess phosphorous from the LTO surface along with much of the gettered impurities. The wafer is then subjected to the well-known conventional adhesion bake which conditions the LTO surface for the next photoresist. Due to the LTO reflow the upper wafer surface is relatively flat.

Then a twelfth photoresist mask shown as layer 65 of FIG. 13 is applied to the surface of the LTO which provides a substantially flat wafer surface. This mask has openings 66 through 71 that are in substantial registry with the polysilicon electrodes 47 through 52 previously established. The wafer is then etched to remove the LTO so as to expose the surfaces of the polysilicon electrodes as shown. The mask is removed and the wafer subjected to a high temperature in an oxidizing atmosphere which acts to diffuse the NPN transistor emitters 72. The arsenic ion implanted in FIG. 12, acting to dope polysilicon electrodes 48 and 49, will diffuse into the intrinsic base 62 and collector contact 29 of the NPN transistor. At the same time, all of the exposed polysilicon contacts will grow an oxide that is about 2000 Å±100 thick.

Then, the thirteenth photoresist mask 73, shown in FIG. 14, is applied and processed to have openings 74, 75 and 75A. Then, a heavy boron ion implant applied. The dose is $2 \times 10^{16}$ atoms per $cm^2$ at an energy of 70 keV. At this energy a substantial fraction of the boron will be applied to the exposed polysilicon contacts 47, 51 and 52. However, the thick pad oxide 33' will resist the ion implant and self align the PNP transistor emitter to lie inside the intrinsic base region 63. The extrinsic base of the NPN transistor contact 47 and the PNP transistor collector contact 52 will also be heavily boron doped. Since oxides surround both of these regions mask 73 does not require precision alignment. After the ion implant, shown in FIG. 14, the resist is removed and the wafer carefully cleaned. Then, it is annealed to activate the boron implant. At this point, the NPN and PNP transistors are both complete and active.

The NPN transistor is composed of emitter 72, extrinsic base 53, intrinsic base 62 (which is joined to extrinsic base 53 by means of the link base portion that lies under pad oxide 32') and collector contact 29, which ohmically contacts epitaxial layer 10.

The PNP transistor is composed of emitter 76, extrinsic base 54, intrinsic base 63 (which is connected to extrinsic base 54 by means of the link base portion underlying pad oxide 33') and collector contact 28 which lies within and ohmically contacts P well 27.

FIG. 15 shows the completed active transistors All contact to the silicon is by way of the doped polysilicon electrodes. The contact system avoids any direct silicon contact to aluminum metallization. This avoids the common problem of aluminum spiking through a shallow emitter. Each polysilicon electrode is provided with a silicide contact produced as follows. The LTO 59, being relatively thick and defined as described for FIG. 13, will act as an etch defining resist. First, the wafer is subjected to an oxide removing etch. This cleans the surface of polysilicon electrodes 47 through 52. The wafer is then coated with platinum. The wafer is then heated to a temperature where platinum and silicon will react to form platinum silicide. The unreacted platinum is then selectively etched away leaving platinum silicide contacts 77 through 82 of FIG. 15.

Platinum silicide is more conductive than the doped polysilicon and thereby reduces transistor contact resistance. Furthermore, the silicide formation reduces the thickness of the polysilicon thereby further reducing contact resistance. Then, as shown in FIG. 16, a barrier metal layer is applied followed by a conductive metallization. These are localized using LTO 59 as a mask. It is preferred that these layers be composed of a titanium-tungsten alloy and aluminum respectively deposited sequential in a suitable single chamber system. Barrier metal contact layers are represented by elements 83 through 88. The conductive metal contacts are represented by elements 89 (the NPN base contact), 90 (the NPN emitter contact), 91 (the NPN collector contact), 92 (the PNP base contact), 93 (the PNP emitter contact), and 94 (the PNP collector contact).

EXAMPLE

IC wafers were manufactured to create NPN and PNP transistors simultaneously using the above-described processing. The NPN transistors had $HF_E$ values of about 160 at a peak collector current of 145 microamperes. The $F_T$ values were 2.88 $GH_Z$. The PNP transistors displayed an $HF_E$ of about 60 at a peak collector current of 109 microamperes. Their $F_T$ values were close to 1.6 $GH_Z$. The transistors had $BV_{CBO}$ values in excess of 50 volts.

The invention has been described and a preferred process embodiment detailed. When a person skilled in the art reads the foregoing description, alternatives and equivalents, within the spirit and intent of the invention, will be apparent. Accordingly, it is intended that the scope of the invention be limited only by the claims that follow.

I claim:

1. A process for simultaneously producing self-aligned NPN and PNP transistors, each one having a collector region, an emitter region, an extrinsic base region, an intrinsic base region and a link base region connecting said extrinsic and intrinsic base regions, said process comprising the steps:
   starting with an epitaxially deposited N type semiconductor substrate wafer;
   covering said substrate wafer surface with a relatively thin pad oxide;
   applying an ion implant mask having openings that define where a PNP transistor will be located;
   ion implanting aluminum at a dose that will provide a suitable PNP transistor collector resistivity;
   applying an ion implant mask having openings that are located at the edge of said aluminum implant where a PNP transistor collector region sinker contact will be created;
   ion implanting a relatively heavy dose of boron that will provide a suitable PNP transistor collector contact sinker;
   applying an ion implant mask having openings that are located where an NPN transistor collector sinker contact is to be located;
   ion implanting a relatively heavy dose of phosphorous that will provide a suitable NPN collector region sinker contact;
   covering said substrate wafer with an oxidation resistant layer of silicon nitride;
   applying an etch resist mask that covers said substrate wafer where said collector contact sinkers and the active regions of said transistors are to be located;
   etching said silicon nitride away except where it is covered by said etch resist mask;
   heating said substrate wafer in an oxidizing atmosphere to diffuse the previously ion implanted aluminum, boron and phosphorous into said substrate wafer and at the same time to grow a relatively thick field oxide on said substrate wafer except where it is covered with silicon nitride, thereby to create an aluminum doped P well surrounded by a field oxide, a boron doped PNP transistor collector sinker contact surrounded by a field oxide, a phosphorous doped NPN transistor collector region sinker contact surrounded by a field oxide and a region of epitaxial semiconductor where an NPN transistor will be located surrounded by a field oxide;
   removing said silicon nitride in a selective etch thereby exposing said pad oxide where the PNP and NPN transistors are to be created;
   applying an etch-resist mask that covers said pad oxide in the regions where transistor link base regions are to be located;
   etching away the thus exposed pad oxide to remove it and thereby expose the surface of said substrate wafer except in transistor link base regions;
   covering said substrate wafer with a layer of undoped polysilicon;
   applying an ion-implant mask having openings that span the PNP transistor extrinsic base and NPN transistor collector sinker regions;
   ion implanting a relatively heavy dose of phosphorous into the exposed polysilicon so that it becomes heavily phosphorous doped;
   applying an ion-implant mask having openings that span the NPN transistor extrinsic base and PNP transistor collector sinker regions;

ion implanting a relatively heavy dose of boron into the exposed polysilicon so that it becomes heavily boron doped;

applying an etch-resist mask contoured to cover the NPN and PNP transistor emitter regions, extrinsic base regions and collector sinker regions;

etching away the thus exposed polysilicon so as to leave undoped polysilicon emitter contacts, along with heavily doped polysilicon extrinsic base and collector sinker diffusion contacts;

heating said wafer to diffuse the phosphorous and boron in the polysilicon into said substrate wafer to create transistor extrinsic bases and collector sinker diffusion contact caps;

applying an ion implant mask having openings that span the PNP transistor locations;

ion implanting phosphorous to a dose that will provide the desired PNP transistor intrinsic base region resistivity;

applying an ion implant mask having openings that span the NPN transistor locations;

ion implanting boron to a dose that will provide the desired NPN transistor intrinsic base resistivity;

heating said substrate wafer atmosphere to diffuse the previously ion-implanted intrinsic base phosphorous and boron to the desired depth in the silicon wafer substrate;

applying an ion-implant mask having openings located over the NPN transistor emitter region and its collector sinker diffusion and the PNP transistor extrinsic base region;

ion implanting a very heavy dose of arsenic thereby to heavily dope the thus exposed polysilicon;

covering said substrate wafer with a layer of oxide film and heating said wafer in a phosphorous oxychloride to convert the surface of said oxide to a low temperature glass and to reflow said glass film and to diffuse said arsenic, previously applied, into said NPN transistor emitter and collector contact sinker diffusion regions and into said PNP transistor extrinsic base regions;

applying an ion-implant mask having openings located over said PNP transistor emitter and collector sinker diffusion regions and the NPN transistor extrinsic base region;

ion implanting a very heavy dose of boron into the thus exposed polysilicon thereby to heavily dope it with boron and heating said substrate wafer to activate the previously applied boron to provide the PNP transistor emitter, collector sinker diffusion cap regions and the NPN transistor extrinsic base regions.

2. The process of claim 1 wherein said diffusion of said previously implanted intrinsic base phosphorous and boron is done in an oxidizing atmosphere which, during the diffusion cycle, will grow said pad oxide to a substantially thicker condition whereby the increased thickness will cause the pad oxide to resist the subsequent emitter ion implant operation.

* * * * *